United States Patent
Ludwig et al.

(10) Patent No.: US 10,531,194 B2
(45) Date of Patent: Jan. 7, 2020

(54) VEHICLE SPEAKER ARRANGEMENT

(71) Applicant: Harman International Industries, Incorporated, Stamford, CT (US)

(72) Inventors: Christopher Ludwig, Birmingham, MI (US); Bradford Hamme, Farmington, MI (US); Riley Winton, Canton, MI (US)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 0 days.

(21) Appl. No.: 15/539,531

(22) PCT Filed: Jan. 28, 2016

(86) PCT No.: PCT/US2016/015393
§ 371 (c)(1),
(2) Date: Jun. 23, 2017

(87) PCT Pub. No.: WO2016/123360
PCT Pub. Date: Aug. 4, 2016

(65) Prior Publication Data
US 2018/0020290 A1      Jan. 18, 2018

Related U.S. Application Data

(60) Provisional application No. 62/109,013, filed on Jan. 28, 2015, provisional application No. 62/114,343, filed on Feb. 10, 2015.

(51) Int. Cl.
H04R 3/12    (2006.01)
H04R 1/28    (2006.01)
(Continued)

(52) U.S. Cl.
CPC ............ H04R 3/12 (2013.01); B60R 11/0217 (2013.01); H03G 3/32 (2013.01); H03G 5/165 (2013.01);
(Continued)

(58) Field of Classification Search
None
See application file for complete search history.

(56) References Cited

U.S. PATENT DOCUMENTS 4,085,289 A * 4/1978 Schmideler ............ H04R 1/021
                                                              181/153
5,218,175 A    6/1993 Scarlata
(Continued)

FOREIGN PATENT DOCUMENTS

CN    104221399 A    12/2014
DE    19909143 A1    11/2000
(Continued)

OTHER PUBLICATIONS

Gettleman et al, "Boys who died lived 17 hours in car trunk, lawyer says." pp. 1-4. Jul. 19, 2005. https://www.nytimes.com/2005/07/19/nyregion/boys-who-died-lived-17-hours-in-car-trunk-lawyer-says.html.*

(Continued)

*Primary Examiner* — Qin Zhu
(74) *Attorney, Agent, or Firm* — Brooks Kushman P.C.

(57) ABSTRACT

An audio system for a vehicle is provided with a woofer speaker having a front side for producing a required bass-range acoustic output in a passenger compartment of the vehicle and a back side having an infinite baffle. The audio system includes a bass-compatible speaker disposed in the passenger compartment of the vehicle. A controller is in communication with the woofer and the bass-compatible speaker and is programmed to distribute the required bass- (Continued)

range sound output to the woofer and the bass-compatible speaker based on at least one of a vehicle speed and a sound output level of the audio system.

20 Claims, 4 Drawing Sheets

(51) Int. Cl.
| | |
|---|---|
| H04R 1/22 | (2006.01) |
| H03G 5/16 | (2006.01) |
| H03G 3/32 | (2006.01) |
| H04R 1/26 | (2006.01) |
| B60R 11/00 | (2006.01) |
| H04R 5/04 | (2006.01) |
| B60R 11/02 | (2006.01) |

(52) U.S. Cl.
CPC ............... *H04R 1/22* (2013.01); *H04R 1/26* (2013.01); *H04R 1/2846* (2013.01); *H04R 1/2869* (2013.01); *B60R 2011/0003* (2013.01); *H04R 5/04* (2013.01); *H04R 2201/021* (2013.01); *H04R 2499/13* (2013.01)

(56) References Cited

U.S. PATENT DOCUMENTS

| | | |
|---|---|---|
| 6,354,651 B1 | 3/2002 | Mori |
| 6,868,937 B2 | 3/2005 | Cass |
| 6,955,241 B2 | 10/2005 | Thorsell et al. |
| 7,328,249 B2 | 2/2008 | Morrow et al. |
| 7,628,249 B2 | 12/2009 | Hanna |
| 8,044,413 B2 | 10/2011 | Albus et al. |
| 8,130,976 B2 | 3/2012 | Linhard et al. |
| 8,139,783 B2 | 3/2012 | Schuster et al. |
| 8,469,447 B2 | 6/2013 | Baker |
| 8,649,548 B1 | 2/2014 | Weber et al. |
| 8,708,092 B2 | 4/2014 | Ito et al. |
| 8,776,944 B2 | 7/2014 | Ito et al. |
| 8,804,991 B2 | 8/2014 | Velican |
| 8,837,762 B2 | 9/2014 | Tada |
| 8,837,768 B2 | 9/2014 | Subat et al. |
| 9,025,790 B2 | 5/2015 | Tada |
| 9,549,243 B2 | 1/2017 | Stys et al. |
| 2001/0030078 A1 | 10/2001 | Jones et al. |
| 2003/0183444 A1* | 10/2003 | Cass .............. H04R 5/02 181/152 |
| 2003/0215101 A1 | 11/2003 | Stuart et al. |
| 2004/0141625 A1 | 7/2004 | Leipold |
| 2004/0202337 A1 | 10/2004 | Jun |
| 2005/0100173 A1* | 5/2005 | Eid .............. H03G 3/32 381/86 |
| 2005/0218694 A1 | 10/2005 | Schoemann et al. |
| 2006/0151910 A1 | 7/2006 | Schoemann et al. |
| 2007/0154055 A1 | 7/2007 | Nichols et al. |
| 2008/0101646 A1 | 5/2008 | Holmi |
| 2008/0240474 A1 | 10/2008 | Sakamoto et al. |
| 2009/0110210 A1 | 4/2009 | Ludwig et al. |
| 2009/0154726 A1* | 6/2009 | Taenzer .............. G10L 25/78 381/94.1 |
| 2009/0220112 A1 | 9/2009 | Fincham |
| 2011/0142251 A1 | 6/2011 | Rosen |
| 2012/0106748 A1 | 5/2012 | Peachey et al. |
| 2012/0219171 A1* | 8/2012 | Velican .............. H04R 1/22 381/353 |
| 2013/0188806 A1 | 7/2013 | Tada |
| 2013/0272537 A1 | 10/2013 | Tada et al. |
| 2013/0284536 A1 | 10/2013 | Ito et al. |
| 2014/0055258 A1 | 2/2014 | Grosse-Budde |
| 2014/0270270 A1 | 9/2014 | Ito |
| 2015/0030178 A1 | 1/2015 | Sulowski |
| 2015/0036840 A1 | 2/2015 | Sulowski et al. |
| 2015/0098586 A1* | 4/2015 | Tanabe ............ H04R 1/2849 381/86 |
| 2016/0016513 A1* | 1/2016 | Di Censo ............ B60Q 9/008 340/467 |

FOREIGN PATENT DOCUMENTS

| | | |
|---|---|---|
| DE | 102008015490 A1 | 10/2009 |
| DE | 102011105474 A1 | 12/2012 |
| DE | 202013105629 A1 | 7/2014 |
| DE | 102013020672 A1 | 8/2014 |
| EP | 0904985 A1 | 3/1999 |
| EP | 1266799 A1 | 12/2002 |
| EP | 1407934 A1 | 4/2004 |
| EP | 1773092 A2 | 4/2007 |
| EP | 2043382 A1 | 4/2009 |
| EP | 2077680 A1 | 7/2009 |
| EP | 2211562 A1 | 7/2010 |
| EP | 2530835 A1 | 12/2012 |
| EP | 2654319 A2 | 10/2013 |
| EP | 2858377 A1 | 4/2015 |
| JP | S63287269 A | 11/1988 |
| JP | H07-267003 A | 10/1995 |
| JP | H07-304398 A | 11/1995 |
| JP | H08-253082 A | 10/1996 |
| JP | 2002240643 A | 8/2002 |
| JP | 2007106281 A | 4/2007 |
| JP | 2007267003 A | 10/2007 |
| JP | 2012121455 A | 6/2012 |
| JP | 2013229730 A | 11/2013 |
| WO | 2011047435 A1 | 4/2011 |
| WO | 2016123360 A1 | 8/2016 |

OTHER PUBLICATIONS

DIYmobileaudio, "another infinite baffle thread." pp. 1-32. Oct. 4, 2011. https://www.diymobileaudio.com/forum/build-logs-project-install-gallery/115050-another-infinite-baffle-thread-3-12s-2007-honda-accord.html.*

Written Opinion and Search Report of International Application No. PCT/US2016/015393; dated Jan. 28, 2016; 12 pages.

Written Opinion and Search Report of International Application No. PCT/US2016/030700; dated Jul. 29, 2016; 9 pages.

EP Search Report, Application No. EP 16 74 4116.1 dated Aug. 14, 2018, 9 pages.

Olson, H. Elements of Acoustical Engineering, 1940, D. Yan Nostrand Company Inc., pp. 60-69 and 127-133.

\* cited by examiner

VEHICLE SPEAKER ARRANGEMENT

CROSS-REFERENCE TO RELATED APPLICATION

This application is the U.S. national phase of PCT Application No. PCT/US16/015393 filed on Jan. 28, 2016, which claims the benefit of U.S. provisional application Ser. No. 62/109,013 filed Jan. 28, 2015, and U.S. provisional application Ser. No. 62/114,343 filed Feb. 10, 2015, the disclosures of which are hereby incorporated in their entirety by reference herein.

TECHNICAL FIELD

The present disclosure generally relates to loudspeakers systems having at least one bass-range, low frequency speaker. More particularly, the present disclosure relates to vehicles having a bass-range speaker.

BACKGROUND

Woofers are utilized in audio systems for the reproduction of bass-range, low frequency sound. One example is European Patent No. EP2077680 by Harman International Industries.

SUMMARY

In the present disclosure, a woofer is mounted at a location and controlled to provide optimum bass-range sound in a vehicle. In one embodiment, an audio system for a vehicle is provided with a woofer speaker having a front side for producing a required bass-range acoustic output in a passenger compartment of the vehicle and a back side having an infinite baffle. The audio system includes a bass-compatible speaker disposed in the passenger compartment of the vehicle. A controller is in communication with the woofer and the bass-compatible speaker and is programmed to distribute the required bass-range sound output to the woofer and the bass-compatible speaker based on at least one of a vehicle speed and a sound output level of the audio system.

In another embodiment, the bass-compatible speaker includes a sealed speaker enclosure that is not in fluid communication the environment outside the vehicle. The woofer does not have a speaker enclosure and the back side of the woofer is adjacent at least one of a vehicle fuel tank, an engine and a vehicle transmission driveshaft.

In another embodiment, the controller is programmed to determine a current sound pressure level in the passenger compartment of the vehicle based on an average input voltage to an amplifier.

In another embodiment, the controller is programmed to determine a current sound pressure level in the passenger compartment of the vehicle based on an average input from a microphone disposed in the vehicle passenger compartment.

In another embodiment, the infinite baffle of the woofer does not include an enclosure so that the back side is in fluid with an environment outside the vehicle.

In another embodiment, the controller is programmed to redistribute the required bass-range acoustic output from the woofer to the bass-compatible speaker if the vehicle speed is less than a threshold speed.

In another embodiment, a bass-range acoustic output from the woofer is generally equal to a redistributed bass-range acoustic output from the bass-compatible speaker.

In one other embodiment, a method of controlling an audio system in a vehicle is provided. The method includes operating a woofer speaker to provide a required bass-range acoustic output. Vehicle data indicative of a vehicle speed is received. A current sound pressure level in a passenger compartment of the vehicle is determined. The method operates a bass-compatible speaker to provide at least a portion of the required bass-range sound output if at least one of the vehicle speed is less than a threshold speed and the current sound level is greater than a threshold volume.

In another embodiment, the method includes operating the bass-compatible speaker to provide at least a portion of the required bass-range acoustic output if the sound pressure level is greater than a threshold volume and the vehicle speed is less than the threshold speed.

In another embodiment, the method includes operating the bass-compatible speaker to provide all of the required bass-range acoustic output if the vehicle speed is less than a secondary threshold speed.

In another embodiment, the method includes increasing the required bass-range acoustic output to the bass-compatible speaker at a redistribution rate being proportional to a rate of deceleration of the vehicle.

In another embodiment, the method includes operating the bass-compatible speaker at a redistributed bass-range acoustic output that is generally equal to the required bass-range acoustic output previously provided from the woofer.

In another embodiment, the method includes restoring the woofer to provide the required bass-range acoustic output when the vehicle speed increases to above the threshold speed.

In one other embodiment, a speaker arrangement for producing bass-range sound in a vehicle is provided. The speaker arrangement includes at least one woofer mounted to a vehicle body structure. The woofer includes a front side in fluid communication with a passenger compartment to emit sound into the passenger compartment. A back side of the woofer is in fluid communication with an environment outside the passenger compartment, wherein the back side of the woofer is not contained in a speaker enclosure, thereby improving bass-range sound in the vehicle and reducing vibrations.

In another embodiment, the speaker arrangement includes a second woofer mounted so that a back side of the second woofer faces the back side of the first woofer. The back side of the second woofer is in fluid communication with the environment outside the passenger compartment.

In another embodiment, the back side of the woofer is adjacent a vehicle fuel tank.

In another embodiment, the woofer is mounted to a firewall and a back side of the woofer is adjacent an engine of the vehicle.

In another embodiment, the woofer is mounted to a transmission tunnel and the back side of the woofer is adjacent a vehicle transmission shaft.

In another embodiment, a second woofer is mounted on an opposite side of the transmission tunnel and oriented so that a back side of the second woofer faces the back side of the first woofer, the back side of the second woofer in fluid communication with the environment outside the passenger compartment.

In another embodiment, the woofer is mounted to a vehicle floor pan.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

The term woofer may mean either a subwoofer or a traditional woofer. Subwoofers and traditional woofers operate in the bass-range. In general, the bass-range is a low frequency range, which may be around 20 Hertz (Hz) to 400 Hz. In the bass-range, subwoofers generally emit sound between 20 Hz and 200 Hz, and traditional woofers generally emit sound between 40 Hz and 400 Hz. As used herein, the term woofer could be a subwoofer or a traditional woofer.

As is known in the art, woofers to produce the bass-range are generally large speakers. Therefore, mounting such large speakers in a vehicle can present a challenge due to packaging issues. To accommodate the large woofer speakers in a vehicle, often the woofer is mounted in a sealed housing, and the housing is placed into a trunk area of a vehicle. Sound emitted from this the sealed woofer in the trunk may be discharged through a vehicle passenger compartment wall or through the vehicle to a space in the passenger compartment. However, this arrangement may not produce optimum base range sound in the passenger compartment of the vehicle.

One way of improving the bass range sound in a vehicle is to provide a woofer where the front side of the woofer is generally in fluid communication with the passenger compartment of the vehicle, and the back side of the woofer is in fluid communication with the environment outside of the passenger compartment. The front side of the woofer refers to the sound emitting side of the woofer. The environment outside of the passenger compartment may be in fluid communication with the atmosphere outside of the vehicle or may be a defined space outside of the passenger compartment.

When the back side of the woofer is in fluid communication with the atmosphere outside of the vehicle or is in fluid communication with an enclosed chamber with a large volume, such as approximately greater than twenty liters, the woofer is considered to have an infinite baffle. One benefit of the open environment, or infinite baffle, is that undesirable resonance in the woofer is reduced because sound waves emitted from the back side of the woofer do not interfere with sound waves emitted from the front side of the woofer. Additionally, another benefit of the open environment, or infinite baffle, is that strain in the diaphragm is reduced because the back side of the woofer vents to the outside atmosphere. As a result, the woofer having an infinite baffle produces a higher sound pressure level (SPL) at low frequency ranges.

When the back side of the woofer is in fluid communication with the outside environment, sound waves emitted from the back side of the woofer may cause noise or disturbance outside the vehicle, which may be more noticeable when the vehicle is operated at a low speed or is stopped.

Figure 1:
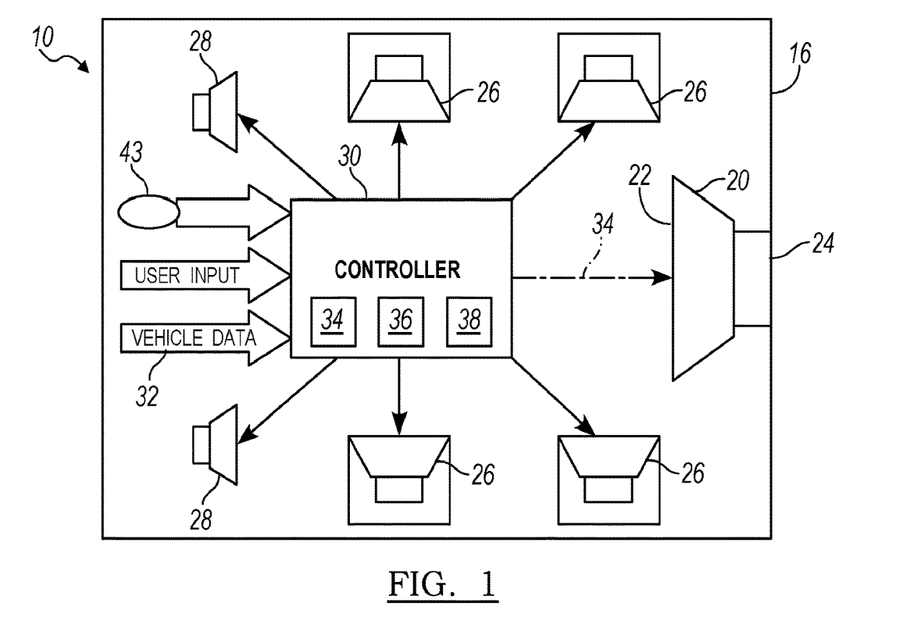
FIG. 1 illustrates a schematic view of an audio system according to an embodiment of the present disclosure.

As shown in FIG. 1, an audio system 10 is illustrated in the passenger compartment 14 of a vehicle. The audio system 10 includes a plurality of speakers for reproducing sound, including at least one woofer 20. The woofer 20 has an infinite baffle where the front side 22 of the woofer is in communication with the passenger compartment 14, whereas the back side 24 of the woofer is in fluid communication with the environment outside the passenger compartment.

The woofer 20 is configured to produce bass-range sound 34. The audio system 10 includes at least one other bass-compatible speaker 26. The bass-compatible speaker 26 is designed to at least emit sound in a portion of the bass-range in addition to emitting frequencies outside of the bass-range. The bass-compatible speaker 26 is not in fluid communication with the atmosphere surrounding the vehicle and therefore, less likely to emit undesirable sound outside the passenger compartment. The audio system 10 may also include other types of speakers 28. The speakers 26, 28 may be any of various types of devices configured to convert electrical signals into audible sound waves.

The audio system 10 also includes a control unit 30 that is in communication with each of the speakers 26, 28 and the woofer 20. The audio control unit 30 could be part of the head unit, infotainment system or may be an amplifier. Alternatively, the audio control unit 30 may be located in an amplifier of the audio system. The audio control unit may include one or more processors 34 configured to perform instructions, commands and other routines in support of the processes described herein. Such instructions and other data may be maintained in a non-volatile manner using a variety of types of computer-readable storage medium. The computer-readable medium 36 (also referred to as a processor-readable medium or storage) includes any non-transitory medium (e.g., a tangible medium) that participates in providing instructions or other data to a memory 38 that may be read by the processor of the audio control unit 30. Computing devices described herein, such as the audio control unit 30, generally include computer-executable instructions, where the instructions may be executable by one or more computing devices such as those listed above. Computer-executable instructions may be compiled or interpreted from computer programs created using a variety of programming languages and/or technologies, including, without limitation, and either alone or in combination, Java™, C, C++, Visual Basic, Java Script, Perl, etc. In general, a processor (e.g., a microprocessor) receives instructions, e.g., from a memory, a computer-readable medium, etc., and executes these instructions, thereby performing one or more processes, including one or more of the processes described herein. Such instructions and other data may be stored and transmitted using a variety of computer-readable media.

The control unit 30 is also operatively configured to receive vehicle input data 32. Vehicle input data 32 may be data indicative of the vehicle speed as well as other vehicle data which may be required by the audio system.

Figure 2:
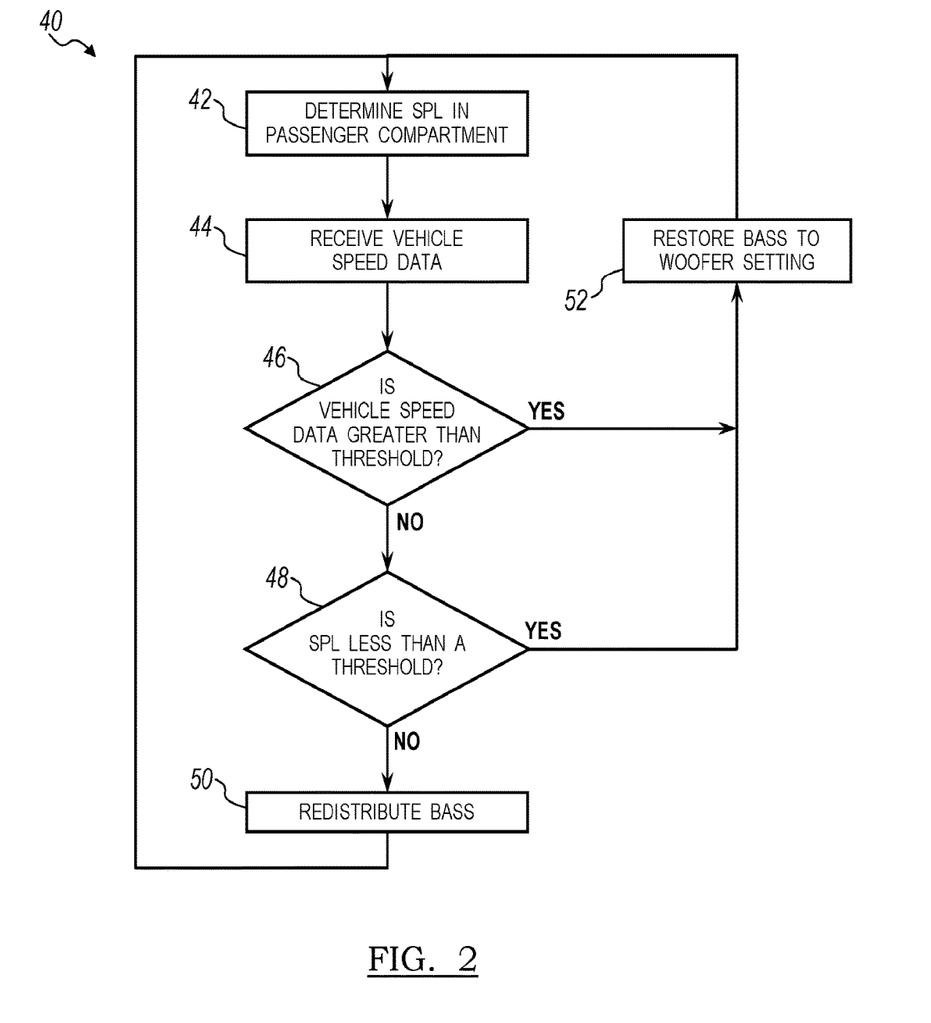
FIG. 2 illustrates a method of controlling the audio system of FIG. 1.

The audio control unit 30 controls bass distribution in the audio system 10. The audio control unit further includes a digital signal processor 34 for implementing a digital signal processing (DSP) algorithm. As shown in FIG. 2, the control unit 30 for the audio system implements a DSP algorithm 40 for managing bass distribution that may be emitted outside of a vehicle.

In step 42, the sound pressure level in the passenger compartment is determined. In the vehicle, the audio control unit 30 may determine sound pressure level in the passenger compartment. Alternatively, a system separate from the audio control unit may determine sound pressure level in the passenger compartment. In either scenario, the determination may be an approximation of sound pressure level.

To determine sound pressure level via the audio control unit 30, the audio control unit may monitor voltage into the amplifier. The audio control unit 30 can average the voltage into the amplifier over time. From there, the audio control unit 30 can relate the average voltage in to the sound pressure level (SPL) in the passenger compartment.

The relationship between voltage into the amplifier and sound pressure level in the passenger compartment may be determined via a lookup table, which can be populated during a test of the audio system and stored in a memory of the audio control unit. To determine a reading of a sound pressure level based on a particular voltage into the amplifier, a test microphone and an analyzing device, which could include an analog-digital-converter, a processor, a digital-analog-converter, a memory, or other suitable device for measuring sound pressure level. The particular voltage into the amplifier ultimately results in the emission of sound by the woofer and any other speakers, such as the bass-compatible speaker. The sound pressure level reading and the particular voltage into the amplifier may be linked and stored in the lookup table. That process may be repeated essentially for other voltages into the amplifier. When a value of the average voltage into the amplifier matches a value in the lookup table, the audio control unit is able to determine the corresponding sound pressure level.

Alternatively, the sound pressure level in the passenger compartment may be determined directly using a microphone 43 and an analysis device, such as an analog-digital-converter, a processor, a digital-analog-converter, a memory, or other suitable device for measuring sound pressure level. The audio control unit 30 may be in communication with the microphone and analysis device and can determine the sound pressure level in the passenger compartment in real-time. By evaluating the sound pressure level in the vehicle with the microphone 43 in real-time, other factors may be accounted for, such as when the windows or sunroof are open, for example.

In addition to sound pressure level, the audio control unit 30 receives input related to operation of the vehicle in step 44. The vehicle operation input may be vehicle data indicative of the vehicle speed. The vehicle operational input may come from an engine control unit, the head unit, a navigation device, a portable device, or any device suitable for providing vehicle speed data.

In step 46, the audio control unit determines if the vehicle speed data is greater than a threshold value. The speed threshold for a vehicle may be based on the type of woofer, the position of the woofer or other characteristics of the audio system. For example, in one application, the threshold value may be when the vehicle speed data indicates the vehicle is travelling less than 25 miles per hour. In another embodiment, the threshold value may be at a vehicle speed less than 10 miles per hour. In another embodiment, there may be multiple speed thresholds.

In step 48, the control unit determines if the sound pressure level in the passenger compartment is less than a threshold value. If the sound pressure level is greater than the threshold level, the control unit does not redistribute bass.

Redistributing bass means that the production of bass in the vehicle is either in part or in whole moved from the woofer to one of the bass-compatible speakers. The purpose of redistributing bass away from the woofer is to prevent the vehicle from emanating an undesirable bass-range sound to the environment outside of the vehicle, including other vehicles nearby. The redistribution of the bass-range to other bass-compatible speakers is useful in situations where the woofers have an infinite baffle condition or do not have a sealed speaker enclosure covering the back side of the speaker.

In step 50, based on the vehicle speed and sound pressure levels, the audio control unit may redistribute the bass from the woofer to other bass-compatible speakers. Based on the vehicle speed operational input, the audio control unit may redistribute bass. In one embodiment, the audio control unit may redistribute bass when the vehicle speed is less than a first threshold and completely redistribute bass from the woofer when the vehicle is completely stopped. In one scenario, redistribution occurs when the car slows over some amount of time. In another scenario, redistribution occurs when the car comes to a complete stop.

The audio control unit 30 may include a digital signal processor that governs how the redistribution of bass occurs. For example, the rate of redistribution is governed by digital signal processor. The rate of redistribution ensures that occupants in the passenger compartment are unlikely to detect that bass is being shifted from the woofer to other bass-compatible speakers. The digital signal processor may shift the bass by adjusting the amplifier's output signals to the woofer and bass-compatible speakers. Even though bass-range sound is moved from the woofer to other bass-compatible speakers, the sound pressure level in the passenger compartment generally does not change.

Figure 1A:
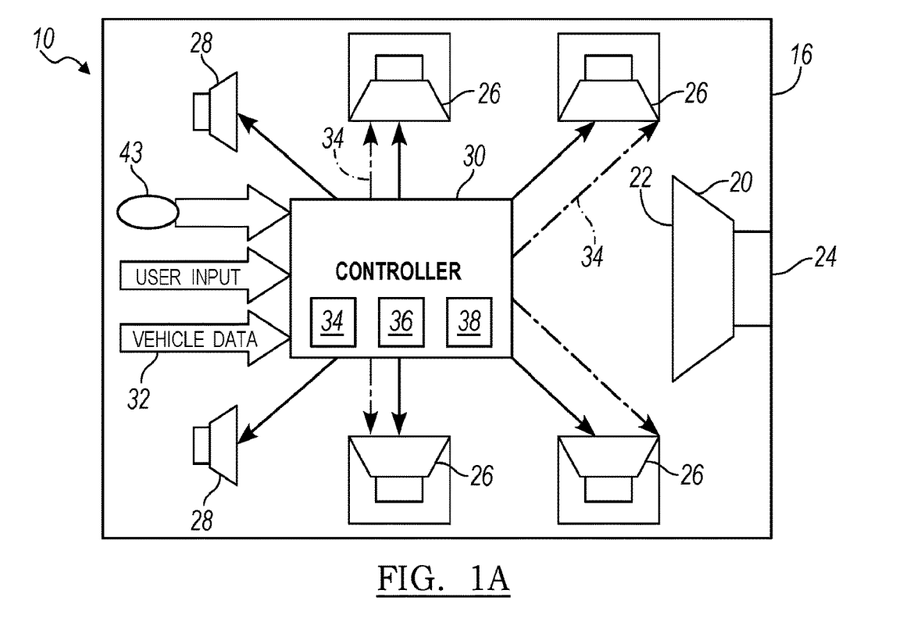
FIG. 1A illustrates another schematic view of an audio system of FIG. 1.

Bass-range distribution refers to a technique by which the amplitude of audio signals at particular frequencies to particular speakers is increased or decreased. The audio control unit distributes the required bass-range acoustic power output between the woofer and bass-compatible speakers. As shown in FIG. 1A, the audio control unit 30 redistributes the audio signals to the bass-compatible speakers 26 to produce bass-range sound 34. In FIG. 1A, the audio control unit 30 does not provide any bass-range signal to the woofer 20. The total bass-range acoustic power, or sound pressure level produced by the woofer 20 in FIG. 1 is generally equal to the total bass-range acoustic power, or sound pressure level produced by the bass-compatible speakers 26 in FIG. 1A.

As illustrated in step 52, the digital signal processor may restore bass to the original woofer 20 after the vehicle speeds back up to a speed above the speed threshold. To restore the bass to the woofer, the digital signal processor adjusts the output signals of the amplifier of the woofer and bass-compatible speakers.

With regard to the processes, systems, or methods, described in FIG. 2, it should be understood that, although the steps of such methods have been described as occurring according to a certain ordered sequence, the processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed as limiting.

Figure 3:
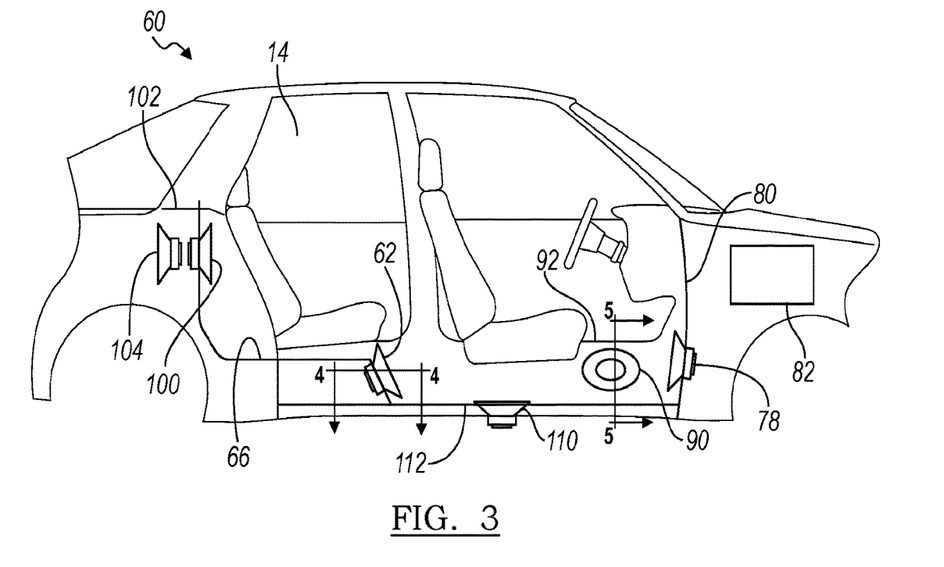
FIG. 3 illustrates a schematic side view of a vehicle including a portion of the audio system of FIG. 1.

FIG. 3 is a side view of a vehicle 60 illustrating various potential mounting positions for the woofer 20. As discussed above with reference to FIG. 1, the front side 22 of the woofer faces the passenger compartment 14, and the back side 24 of the woofer is in fluid communication with a space outside the vehicle passenger compartment 14. The space may be defined by previously unutilized or underutilized areas in the vehicle 60 to provide optimum sound. The space allows the woofer to function as if the back side of the woofer is cooperating with an infinite baffle as previously discussed. The space may be an open space (in communication with the outside atmosphere) or an enclosed (or partially enclosed) space. The back side of the woofer faces the space so the space functions as an infinite baffle to enhance and amplify the bass-range of the woofer. Where the space is enclosed, the volume may be approximately greater than twenty liters. However, the size of the enclosure may be different for different speakers to have the effect or performance of an infinite baffle. The volume of the enclosure that produces minimal losses and performs as an infinite baffle, may be determined, for example, by an equation $$V_B \geq 10 V_{AS}$$

where $V_B$ is the volume of the box or enclosure, and $V_{AS}$ is defined as the volume of air having same acoustic compliance as driver suspension ($=\rho_0 c^2 C_m S_D^2$). Therefore, the size of the enclosure may be specific to the transducer driver and may be directly related to the surface area and the mechanical compliance of the driver. Other equations or constants may be used to define a enclosure volume that functions as an infinite baffle by producing minimal losses. Once known, the equation may define an enclosure volume that produces minimal losses, for example, a 0.8 dB loss in output at 1 Hz, and may be considered an infinite baffle.

The dedicated space or enclosure can be formed by any rigid vehicle body structure and therefore, this arrangement provides for a robust design in addition to enhanced sound quality without additional components.

In one example, the speaker 62 is mounted to the vehicle body structure of the passenger compartment 14. In this is example, the speaker 62 may be mounted to the interior floor panel of the vehicle so that the front side of the speaker 62 provides bass-range sound to passenger compartment 14. The back side of the speaker 62 is outside of the passenger compartment and is disposed adjacent the fuel tank 64 of the vehicle. The fuel tank 64 and the back side of the woofer 62 reside in the area outside of the passenger compartment.

Figure 4:
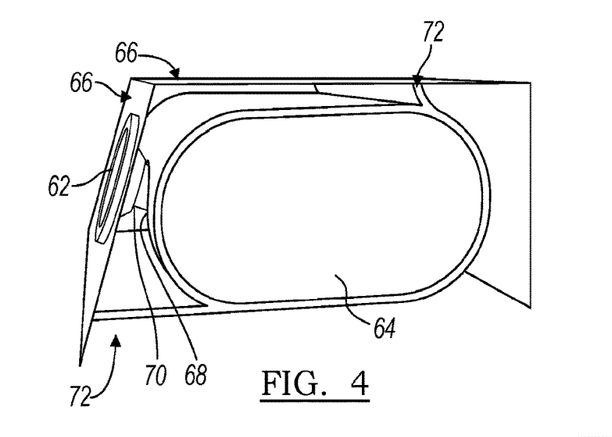
FIG. 4 illustrates a detailed section view through section 4-4 of the audio system and vehicle in FIG. 3.

FIG. 4 provides a more detailed view of the speaker 62. The speaker 62 is mounted to the sheet metal 66 of the body structure that defines the passenger compartment. Mechanical fasteners, such as screws, nuts and bolts may be used to mount the woofer 62 to a vehicle body structure. For example, the woofer may include a frame with holes for receiving the mechanical fasteners. Additionally, the sheet metal 66 or body structure may include an opening for receiving the woofer. The size of the frame could be larger than the opening. Alternatively, the woofer may be mounted in the vehicle utilizing other techniques known to a person of ordinary skill in the art.

As shown in FIG. 3, the woofer 62 may be mounted in a rear-center location of the passenger compartment 14 beneath the rear seat. However, the woofer 62 may be mounted in any suitable location in order to utilize the space defined between the body structure 66 to which the speaker is mounted and the fuel tank 64. In applications where the fuel tank 64 is stamped, blow-molded or molded to fill unused space around the body structure, the fuel tank 64 may have a complex shape. The complex shape of the fuel tank 64 may be formed to include a notch 68 adjacent the back side 70 of the speaker 62, as shown in FIG. 4. Additionally, extension surfaces 72 may be formed that extend from the fuel tank 64 to the body structure 66 to which the speaker 62 is mounted.

As illustrated in FIG. 3, a speaker 78 may be mounted to the firewall 80 of the vehicle to provide an infinite baffle speaker arrangement. The firewall 80 is body structure formed of sheet metal that separates the passenger compartment 14 from the compartment containing the vehicle's engine 82. The woofer 78 is mounted to the firewall 80 and faces the vehicle passenger compartment 14 while the back side of the woofer 78 is adjacent the engine 82 and open to and in fluid communication with the outside environment through the engine compartment. Accordingly, the woofer 78 transmits the enhanced bass-range to the vehicle passenger compartment 14 through its front side. An NVH hat may be added to the opening for the back side of the woofer 78 to provide noise isolation from the outside atmosphere while allowing fluid communication between the woofer and the outside environment. The NVH hat may be formed of any suitable acoustic resistive material. Accordingly, unwanted resonance is significantly reduced and these woofers significantly prevent outside noise from entering the vehicle. It is understood that the acoustic resistive material may also form components of the woofer such as the diaphragm. The diaphragm may be formed from a relatively stiffer material such as Kevlar or other suitable material.

Figure 5:
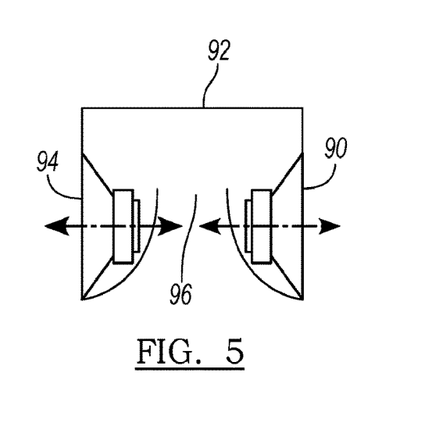
FIG. 5 illustrates a detailed section view through section 5-5 of the audio system and vehicle in FIG. 3.
Figure 6:
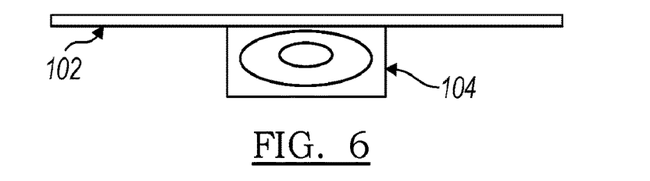
FIG. 6 illustrates a back side view of a portion of the audio system and vehicle in FIG. 3.

As also illustrated in FIG. 3, a speaker 90 may be mounted in a front-center location of the passenger compartment 14. For example, the speaker 90 may be mounted along a front-center console 92. At least two woofers 90, 94 may be mounted along the center console 92 facing into the passenger compartment in opposite directions. The woofers are arranged so that the back side of the second woofer 94 faces the back side of the first woofer 90, as shown in FIG. 5. By mounting the speakers 90, 94 so that the back sides face each other, the mechanical forces of each woofer negate each other and reduce mechanical vibration in the system.

In the embodiment shown in FIG. 5, the back sides of the speakers 90, 94 are also in fluid communication with the environment via a transmission tunnel 96. The transmission tunnel 96 provides a space for a transmission drive shaft to extend between drive wheels and a transmission. As shown in FIG. 5, one woofer 90 would be mounted on one side of the transmission tunnel 96 while the other woofer 94 is mounted on the other side of the transmission tunnel 96. Moreover, an NVH hat and/or acoustic resistive material may be added to the tunnel opening or coupled to the back side of the woofers 90, 94 to provide noise isolation from the outside atmosphere while allowing fluid communication between the woofers 90, 94 and the outside environment.

Therefore, by allowing the back side of the woofer to be in fluid communication with the open environment outside of the vehicle, unwanted resonance is significantly reduced and these woofers may reduce also outside noise from entering the vehicle via the acoustic resistive material. Accordingly, sound quality in the bass-range is improved due to the reduced mechanical vibration as well as the multi-directional emission of the bass-range.

Figure 7:
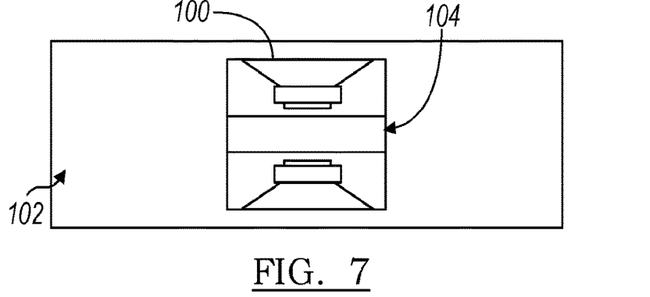
FIG. 7 illustrates a top view of the portion of the audio system and vehicle in FIG. 6.

As also illustrated in FIG. 3, a speaker 100 may be mounted adjacent the rear deck 102 of the vehicle. As shown in FIG. 7, a pair of speakers 100, 104 may be mounted adjacent the rear deck 102. The front side of speaker 100 is open to the passenger compartment 14. The back sides of the woofers 100, 104 face each other thereby cancelling any vibration emitted from the back sides of the speakers 100, 104 when operated. Unlike the other woofers shown in FIG. 3, the woofers 100, 104 operate with an enclosed environment behind the woofer given that these woofers are located at the rear deck of the vehicle. While the speakers 100, 104 are in the enclosed environment below the rear deck, such as the vehicle trunk, may be large enough to be considered an infinite baffle.

As illustrated in FIG. 3, a speaker 110 may be mounted under a seat. The seat may be a rear passenger seat or a front passenger seat. Similar to the woofer 78 which is mounted to the firewall, the woofer under the seat is affixed to floor pan 112 that is a rigid vehicle body structure. The floor pan 112 is a sheet metal portion of the vehicle body that defines the barrier between the interior passenger compartment and the road below the vehicle.

Traditionally, the vehicle would include floor grommets in an area near the woofer 110. However, to provide a condition such that the woofer 110 is in fluid communication the atmosphere outside of the vehicle having an infinite baffle, the grommets may be removed or modified. Accordingly, the removal or adjustment of the grommets allows the back side of the woofer 110 to communicate with the environment outside of the vehicle while the front side faces the passenger compartment 14 thereby providing enhanced bass-range sound in the vehicle.

In yet another arrangement, two woofers may be mounted under a seat of a vehicle. In doing so, the woofers are arranged so the front faces are generally perpendicular to the seat bottom. Similar to the speakers 100, 104, the back side of one woofer faces the back side of the other woofer. The front sides of the woofer emit sound into the cabin. This arrangement reduces unwanted mechanical vibration because the movements of each woofer cancel out the mechanical vibration from the other woofer. Furthermore, given the perpendicular orientation of the woofer to the seat bottom, the seat bottom does not experience any unwanted mechanical vibration transmitted from the woofers.

A person of ordinary skill in the art understands that in speaker arrangements where the back side of the woofer is disposed in an enclosed space, such as the space in the trunk below the rear deck or the space between the fuel tank, the transducer for the woofer would be modified in order to accommodate the enclosed baffle environment. Therefore, the woofer can be designed to work with the volume of the baffle behind the speaker. The woofer can be modified to adjust its electromechanical parameters (such as Thiele-Small parameters) to define how the woofer will act when placed in different enclosures. Examples include increasing the stiffness of the speaker suspension, decreasing mass of the moving speaker cone, increasing electrical impedance, etc.

Figure 8:
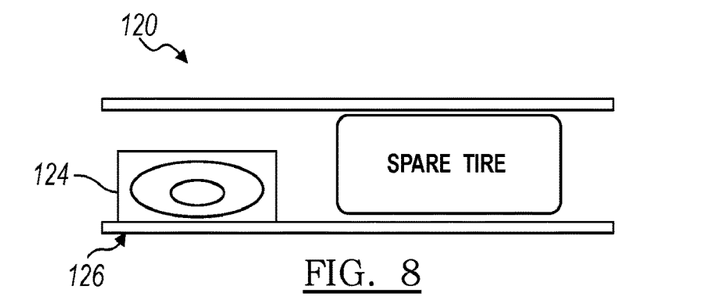
FIG. 8 illustrates a side view of a portion of the audio system and a vehicle.
Figure 9:
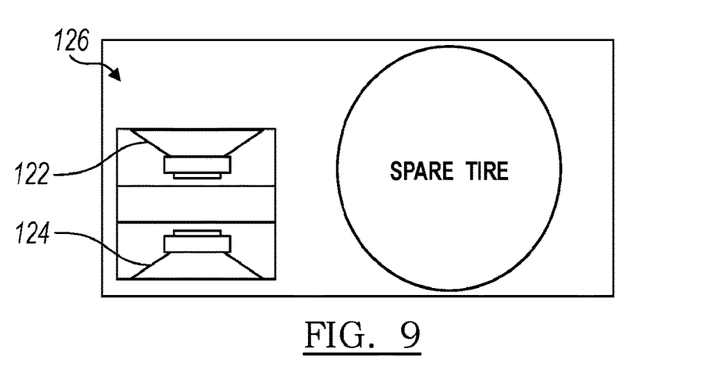
FIG. 9 illustrates a top view of the portion of the audio system and vehicle in FIG. 8.

FIGS. 8-9 illustrate another speaker arrangement 120 for a sport-utility type vehicle, or a vehicle that does not have an enclosed trunk and the cargo space behind the rear seats is open and part of the passenger compartment. The speaker arrangement 120 includes a first woofer 122 and a second woofer 124 mounted in the spare tire area or cargo well 126 of the vehicle. The spare tire well 126 may be used as an enclosed baffle or a partially enclosed baffle for the woofers 122, 124 thereby providing optimized bass-range sound in the passenger compartment area. Moreover, the woofer is affixed to a rigid vehicle body structure such that there is little to no unwanted mechanical vibration when the woofers 122, 124 are operating. Again, where there is a partially enclosed baffle where the back side of the woofer is in fluid communication with the environment outside the passenger cabin, an NVH hat may be added to the opening for the back side of the woofers or coupled to the back side of the woofer. The NVH hat provides noise isolation from the outside atmosphere while allowing fluid communication between the woofer and the outside environment.

In addition to enhanced sound quality inside the vehicle, another benefit of mounting the woofers directly to the rigid vehicle body structure, such as a floor pan or firewall unwanted mechanical vibration as the woofer operates are significantly reduced.

The various speaker arrangements disclosed here provide for robust designs, which enhance sound quality. In other examples, the area outside of the passenger compartment may be associated with a battery pack for the vehicle in a hybrid or electric vehicle application.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An audio system for a vehicle comprising:
    a woofer having a front side for producing a required bass-range output in a passenger compartment of the vehicle and a back side having an infinite baffle defined with the atmosphere outside of the vehicle while the vehicle is moving;
    a bass-compatible speaker disposed in the passenger compartment of the vehicle; and
    a controller in communication with the woofer and the bass-compatible speaker and programmed to:
        distribute only the required bass-range output to the woofer and the bass-compatible speaker based on at least one of a vehicle speed and a sound output level of the audio system.

2. The audio system of claim 1 wherein the bass-compatible speaker includes a sealed speaker enclosure that is not in fluid communication with the atmosphere outside the vehicle.

3. The audio system of claim 1 wherein the woofer does not have a speaker enclosure and the back side of the woofer is adjacent at least one of a vehicle fuel tank, an engine and a vehicle transmission driveshaft.

4. The audio system of claim 1 wherein the controller is programmed to determine a current sound pressure level in the passenger compartment of the vehicle based on an average input from a microphone disposed in the vehicle passenger compartment.

5. The audio system of claim 1 wherein the infinite baffle of the woofer does not include an enclosure so that the back side is in fluid communication with the atmosphere outside the vehicle.

6. The audio system of claim 1 wherein the controller is programmed to redistribute the required bass-range output from the woofer to the bass-compatible speaker if the vehicle speed is less than a threshold speed.

7. The audio system of claim 6 wherein a bass-range acoustic output from the woofer is generally equal to a redistributed bass-range acoustic output from the bass-compatible speaker.

8. A method of controlling an audio system in a vehicle, the method comprising:
 operating a woofer speaker to provide a required bass-range acoustic output, wherein a back side is not enclosed and is in fluid communication with the atmosphere outside of the vehicle while the vehicle is moving;
 receiving vehicle data indicative of a vehicle speed;
 determining a current sound pressure level in a passenger compartment of the vehicle; and
 redistributing at least a portion of only the required bass-range acoustic output to a bass-compatible speaker from the woofer speaker if at least one of the vehicle speed is less than a threshold speed and the current sound pressure level is greater than a threshold volume.

9. The method of claim 8 further comprising operating the bass-compatible speaker to provide at least a portion of the required bass-range acoustic output if the current sound pressure level is greater than a threshold volume and the vehicle speed is less than the threshold speed.

10. The method of claim 8 further comprising operating the bass-compatible speaker to provide all of the required bass-range acoustic output if the vehicle speed is less than a secondary threshold speed.

11. The method of claim 8 further comprising increasing the required bass-range acoustic output to the bass-compatible speaker at a redistribution rate being proportional to a rate of deceleration of the vehicle.

12. The method of claim 8 wherein the woofer speaker does not include an enclosure so that the back side is in fluid with the atmosphere outside the vehicle; and
 wherein the bass-compatible speaker includes a sealed speaker enclosure that is not in fluid communication the atmosphere outside the vehicle.

13. The method of claim 8 further comprising operating the bass-compatible speaker at a redistributed bass-range acoustic output that is equal to the required bass-range acoustic output previously provided from the woofer.

14. The method of claim 8 further comprising restoring the woofer speaker to provide the required bass-range acoustic output when the vehicle speed increases to above the threshold speed.

15. A speaker arrangement for producing bass-range sound in a vehicle, the speaker arrangement comprising:
 at least one woofer mounted to a vehicle body structure, the woofer comprising:
  a front side in fluid communication with a passenger compartment to emit sound into the passenger compartment; and
  a back side of the woofer in fluid communication with the atmosphere outside the vehicle, wherein the back side of the woofer is not contained in a speaker enclosure, thereby improving bass-range sound in the vehicle and reducing vibrations,
 wherein the woofer is mounted to a transmission tunnel and the back side of the woofer is adjacent a vehicle transmission shaft.

16. The speaker arrangement according to claim 15 further comprising a second woofer mounted so that a back side of the second woofer faces the back side of the first woofer, the back side of the second woofer in fluid communication with the atmosphere outside the vehicle.

17. The audio system of claim 1 wherein the woofer is mounted to a firewall and a back side of the woofer is adjacent an engine of the vehicle.

18. The audio system of claim 1 wherein the woofer is mounted to a transmission tunnel and the back side of the woofer is adjacent a vehicle transmission shaft.

19. The audio system of claim 18 further comprising a second woofer mounted on an opposite side of the transmission tunnel and oriented so that a back side of the second woofer faces the back side of the first woofer, the back side of the second woofer in fluid communication with the atmosphere outside the passenger compartment.

20. The audio system of claim 1 wherein the woofer is mounted to a vehicle floor pan.

* * * * *